United States Patent
Gealy et al.

(10) Patent No.: US 6,919,257 B2
(45) Date of Patent: Jul. 19, 2005

(54) METHOD OF FORMING A CAPACITOR

(75) Inventors: F. Daniel Gealy, Kuna, ID (US); Thomas M. Graettinger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/172,253

(22) Filed: Jun. 14, 2002

(65) Prior Publication Data

US 2003/0057472 A1 Mar. 27, 2003

Related U.S. Application Data

(62) Division of application No. 09/770,699, filed on Jan. 26, 2001, which is a division of application No. 09/286,807, filed on Apr. 6, 1999, now Pat. No. 6,696,718.

(51) Int. Cl.[7] .................... H01L 21/20; H01L 21/8242
(52) U.S. Cl. ................... 438/398; 438/255; 438/296
(58) Field of Search ........................ 438/396, 255, 438/398, 397, 253, 254

(56) References Cited

U.S. PATENT DOCUMENTS

| | | |
|---|---|---|
| 5,245,206 A | 9/1993 | Chu et al. |
| 5,313,089 A | 5/1994 | Jones, Jr. |
| 5,392,189 A | 2/1995 | Fazan et al. |
| 5,444,013 A | 8/1995 | Akram et al. |
| 5,478,772 A | 12/1995 | Fazan ......................... 438/240 |
| 5,563,089 A | 10/1996 | Jost et al. |
| 5,563,090 A | 10/1996 | Lee et al. |
| 5,604,696 A | 2/1997 | Takaishi |
| 5,622,893 A | 4/1997 | Summerfelt et al. |
| 5,856,937 A | 1/1999 | Chu et al. |
| 5,866,453 A * | 2/1999 | Prall et al. ................... 438/253 |
| 6,077,742 A * | 6/2000 | Chen et al. ................... 438/255 |
| 6,087,694 A | 7/2000 | Ohno et al. ................... 257/309 |
| 6,090,660 A | 7/2000 | Noble, Jr. ................... 438/238 |
| 6,090,704 A | 7/2000 | Kim et al. ................... 438/239 |
| 6,153,898 A | 11/2000 | Watanabe et al. ........... 257/310 |
| 6,153,903 A | 11/2000 | Clampitt ..................... 257/309 |
| 6,165,834 A | 12/2000 | Agarwal et al. ............. 257/310 |
| 6,171,925 B1 | 1/2001 | Graettinger et al. ........ 257/310 |
| 6,191,443 B1 | 2/2001 | Al-Shareef et al. |
| 6,222,722 B1 | 4/2001 | Fukuzumi et al. .......... 257/308 |
| 6,265,260 B1 | 7/2001 | Alers et al. |
| 6,284,655 B1 | 9/2001 | Marsh |
| 6,507,065 B2 | 1/2003 | Figura et al. |
| 2003/0080369 A1 | 5/2003 | Gealy et al. |
| 2003/0100163 A1 | 5/2003 | Gealy et al. |
| 2003/0100164 A1 | 5/2003 | Gealy et al. |

OTHER PUBLICATIONS

U.S. Appl. No. 09/286,807, filed Apr. 6, 1999, Gealy et al.
U.S. Appl. No. 09/770,699, filed Jan. 26, 2001, Gealy et al.
U.S. Appl. No. 10/159,695, filed May 30, 2002, Gealy et al.

* cited by examiner

*Primary Examiner*—Michael Trinh
(74) *Attorney, Agent, or Firm*—Kirkpatrick & Lockhart Nicholson Graham LLP

(57) ABSTRACT

A method of forming a capacitor is disclosed. The method includes forming a first electrode having a non-smooth surface and selected from the group consisting of transition metals, conductive oxides, alloys thereof, and combinations thereof. The method further includes forming a second electrode, and forming a dielectric between the first and second electrodes.

27 Claims, 7 Drawing Sheets

METHOD OF FORMING A CAPACITOR

CROSS REFERENCE TO RELATED APPLICATIONS

This application is a divisional of copending U.S. patent application Ser. No. 09/770,699, filed Jan. 26, 2001, which is a divisional of U.S. patent application Ser. No. 09/286,807, filed Apr. 6, 1999, now U.S. Pat. No. 6,696,718.

STATEMENT REGARDING FEDERALLY SPONSORED RESEARCH OR DEVELOPMENT

Not Applicable.

BACKGROUND OF THE INVENTION

1. Field of the Invention

The present invention is directed generally to a capacitor and method for forming a capacitor and, more particularly, to a capacitor and method for forming a capacitor having an electrode formed from a transition metal, a conductive metal-oxide, alloys thereof, or combinations thereof.

2. Description of the Background

Minimum feature sizes in integrated circuits are sufficiently small that some fabrication processes are no longer effective. For example, in many applications sputter deposition is not effective for filling openings. Furthermore, the smaller dimensions are requiring higher performance from components and devices. For example, greater capacitance is required from small capacitors. One way to obtain higher capacitance is to use dielectrics having greater dielectric constants. Often, however, it is necessary to heat the dielectric to high temperatures in order to obtain the higher dielectric constant, and such heating can have adverse effects on the electrodes used to form the capacitor. For example, the electrodes will often oxidize, and the oxide will act as a lower permittivity dielectric in series with a higher permittivity dielectric. As a result, the oxide formed from the electrode will increase the effective distance between the electrodes, thereby decreasing the capacitance.

Therefore, the need exists for a capacitor and method for forming capacitors that do not suffer adverse effects when used with dielectrics having high dielectric constants.

BRIEF SUMMARY OF THE INVENTION

The present invention is directed to a capacitor including a first electrode selected from a group consisting of transition metals, conductive metal-oxides, alloys thereof, and combinations thereof. The capacitor also includes a second electrode and a dielectric between the first and second electrodes. The present invention may be used to form capacitors in integrated circuits, such as those in memory devices and processors.

The present invention also includes a method of forming a capacitor. The method includes forming a first electrode selected from a group consisting of transition metals, conductive metal-oxides, alloys thereof, and combinations thereof. The method also includes forming a second electrode and forming a dielectric between the first and second electrodes.

The present invention solves problems experienced with the prior art because it provides for capacitors having improved physical structures, such as higher capacitance, smaller physical size, and smaller footprint, by utilizing improved dielectric properties, including electrodes that do not form dielectrics during subsequent processing steps.

Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements. Those of ordinary skill in the art will recognize that other elements may be desirable. However, because such elements are well known in the art, and because they do not facilitate a better understanding of the present invention, a discussion of such elements is not provided herein.

Advantages of the present invention may be realized using a number of structures and technologies, such as doped silicon substrate, silicon-on-insulator, silicon-on-sapphire, and thin film transistor. The term "substrate", as used herein, refers to a structure that is often the lowest layer of semiconductor material in a wafer or die, although in some technologies the substrate is not a semiconductor material. The term "substrate assembly", as used herein, shall mean a substrate having one or more layers or structures formed thereon or therein. The substrate assembly may include one or more active or operable portions of a semiconductor device.

Figure 1:
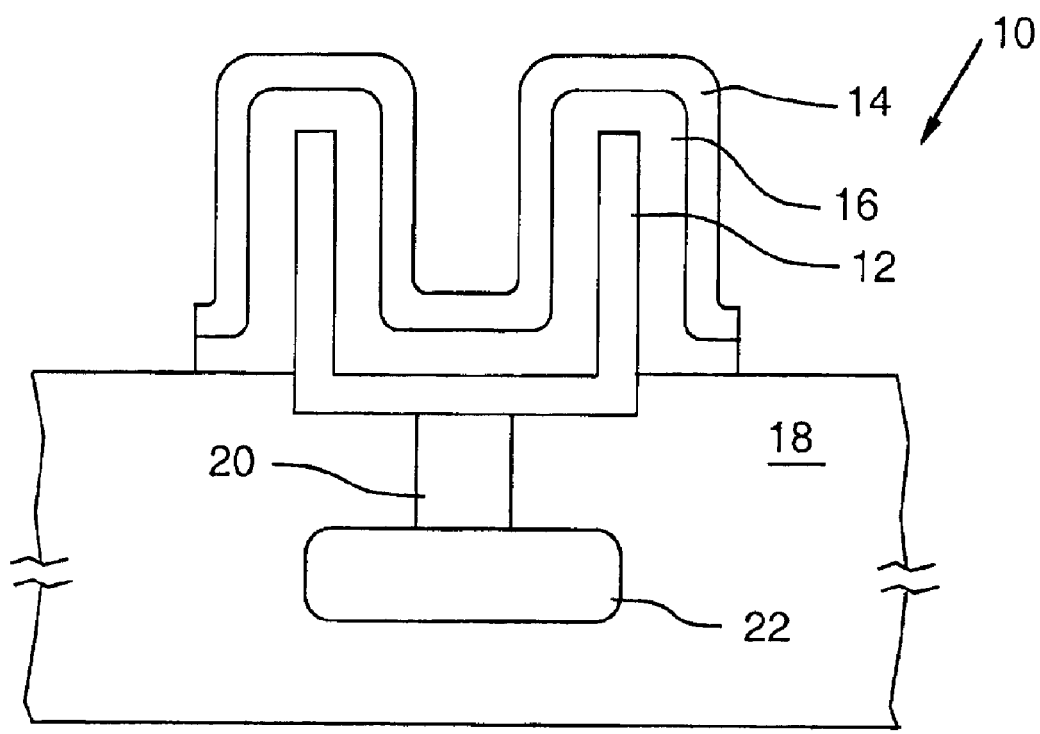
FIG. 1 is a cross-sectional view of a capacitor constructed according to the teachings of the present invention.

FIG. 1 is a cross-sectional view of a capacitor 10 formed according to the present invention. The capacitor 10 includes a first electrode 12, a second electrode 14, and a dielectric 16 formed between the first and second electrodes 12, 14. The capacitor 10 is illustrated as a crown-shaped capacitor, although benefits of the present invention may be realized with capacitors 10 having many forms, including flat capacitors and post capacitors. The capacitor 10 may be formed on a substrate assembly 18, and may include an interconnect 20 to, for example, a doped region 22.

The first electrode 12 may be formed from a transition metal, such as Pt, Rh, Ir, Ru, and Pd; from metals that form conductive metal oxides, such as $IrO_x$, $RuO_x$ and $RhO_x$ (where x<4); from conductive oxides; and from alloys of any of those materials. The first electrode 12 may also be formed from any combination of the foregoing materials. The first electrode 12 may also be formed from other materials that either do not oxidize during the formation of the capacitor 10, or whose oxidized forms are conductive.

The second electrode 14 may be formed from any of the materials that may be used for the first electrode 12. However, because the second electrode 14 is often not exposed to a high temperature processing step, the second electrode 14 may be formed from other materials that may not be suitable for use as the first electrode 12. Examples of those other materials are conductive metal nitrides, WN, aluminum, TiN, TaN, and polysilicon.

The dielectric 16 may be formed from a material that will provide a high dielectric constant, such as an insulating transition metal binary, ternery, or quarternery oxide. For example, the dielectric may be formed by a chemical vapor deposition (CVD) of barium strontium titanate (BST), $SrTiO_3$, $Sr_wBi_xTa_yO_z$, $Ba_xSr_{1-x}TiO_3$ where 0<x<1, or $Ta_2O_5$, followed by heating the dielectric 16 to 400 degrees C. or more in the presence of oxygen-containing ambient, such as $O_2$, $N_2O$, $O_3$, or NO.

The substrate assembly 18 may be formed, for example, from borophosphosilicate glass (BPSG), TEOS oxide, $SiO_2$, or $Si_3N_4$. The interconnect 20 may be formed, for example, from polysilicon, TiN, or tungsten. Alternatively, the interconnect 20 may be omitted and the first electrode 12 may be connected directly to the doped region 22. Alternatively, the first electrode 12 may be connected to a metal contact or metal line rather than the doped region 22, or the first electrode 12 may be left floating. The substrate assembly 18 may be formed from one or more layers. For example, in the illustrated embodiment a first substrate layer may be formed and planaraized. The first layer may be masked and etched, and the interconnect 20 formed in the first substrate layer. Thereafter, an additional substrate layer may be formed above the first layer and covering the interconnect 20.

Figure 2:
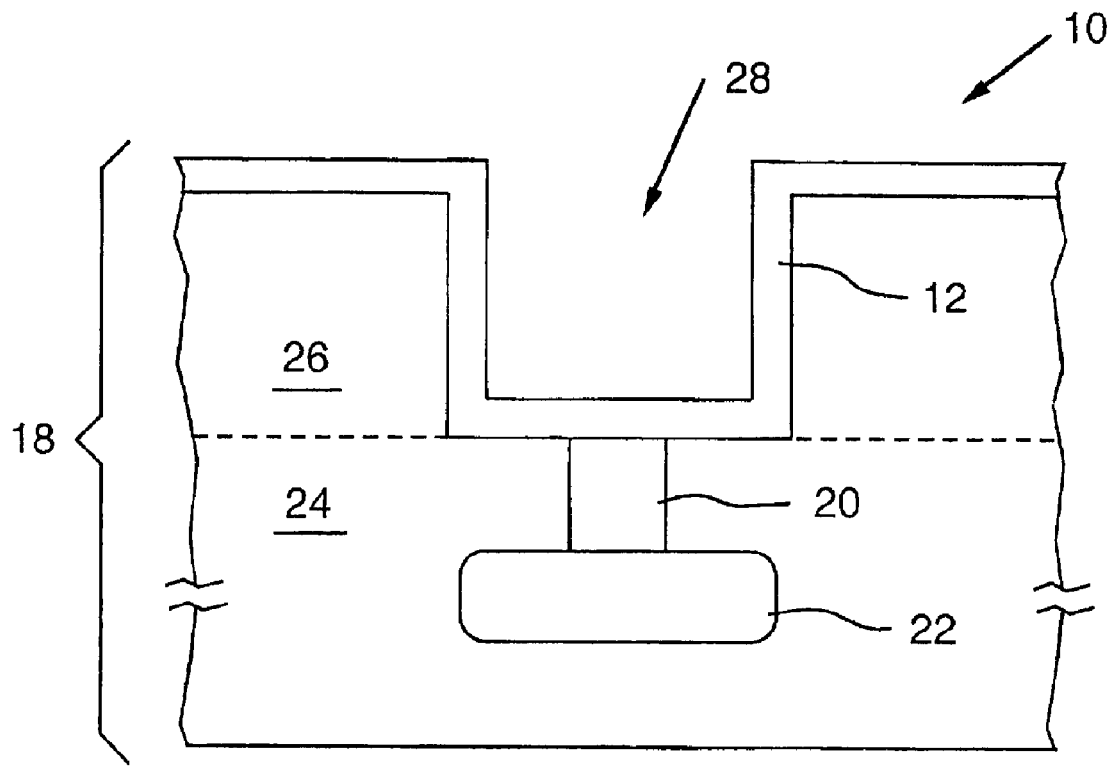
FIG. 2 is a cross-sectional view of a capacitor in an early stage of fabrication.

FIG. 2 is a cross-sectional view of the capacitor 10 in an early stage of fabrication. The substrate assembly 18 may be formed from a first substrate layer 24 and a second substrate layer 26. The first substrate layer 24 is formed first, and the interconnect 20 may be formed in the first substrate layer 24 at that time. The interconnect 20 may connect the capacitor 10 to another portion 22 of the device in which the capacitor 10 is formed, such as a doped region. Thereafter, the second substrate layer 26 may be formed on top of the first substrate layer 24, and an opening 28 may be formed in the second substrate layer 26 at that time. The opening 28 may be formed, for example, by selectively masking the second substrate layer 26 so that only the portion of the second substrate layer 26 where the opening 28 is to be formed is exposed, by selectively and anisotropically etching the second substrate layer 26 to form the opening 28, and then removing the mask. The first electrode 12 may be formed in the opening 28 by, for example, depositing a layer of material that will form the first electrode 12, masking that layer, etching the material that is to be removed, and removing the mask to leave the first electrode 12.

Figure 3:
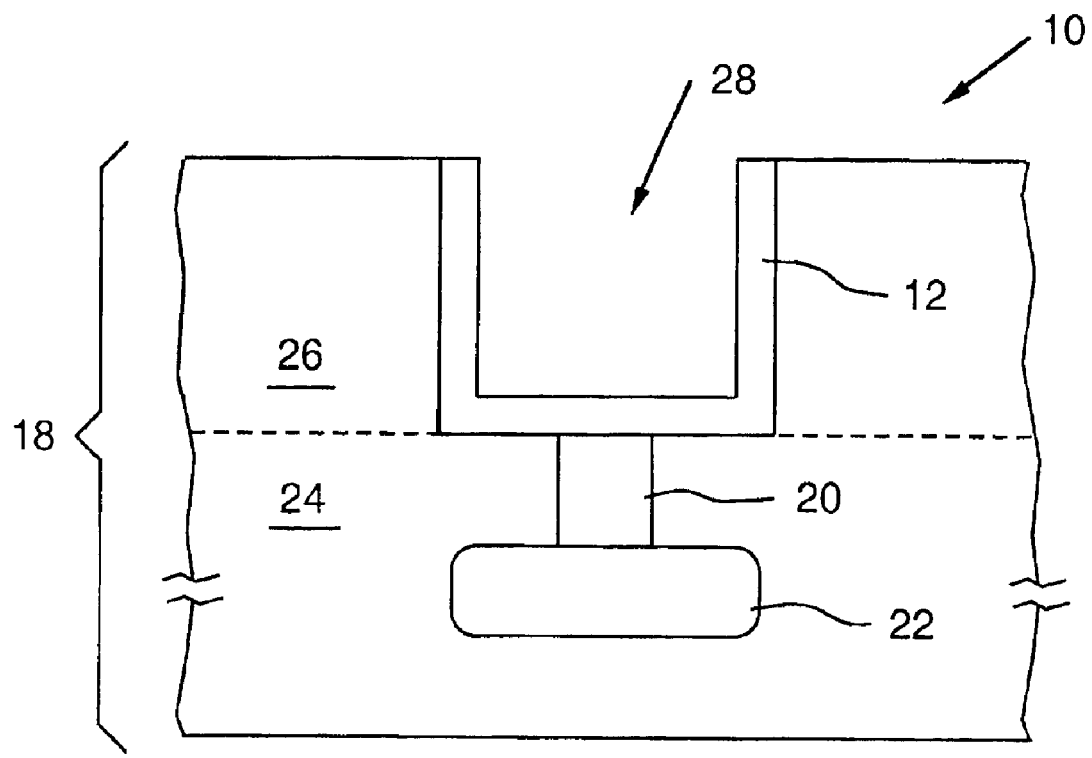
FIG. 3 is a cross-sectional view of the capacitor of FIG. 2 after the material forming the first electrode is removed from the top surface of the substrate assembly.

FIG. 3 is a cross-sectional view of the capacitor 10 after the first electrode 12 has been removed from the top surface of the substrate assembly 18. The removal may be performed by, for example, a mechanical abrasion step, such as chemical mechanical planarization ("CMP"). In that example, a protective material, such as photoresist, may be used to fill the opening 28 to prevent materials removed by the CMP from falling into the opening 28. Alternatively, the removal can be performed by a blanket etch back process.

Figure 4:
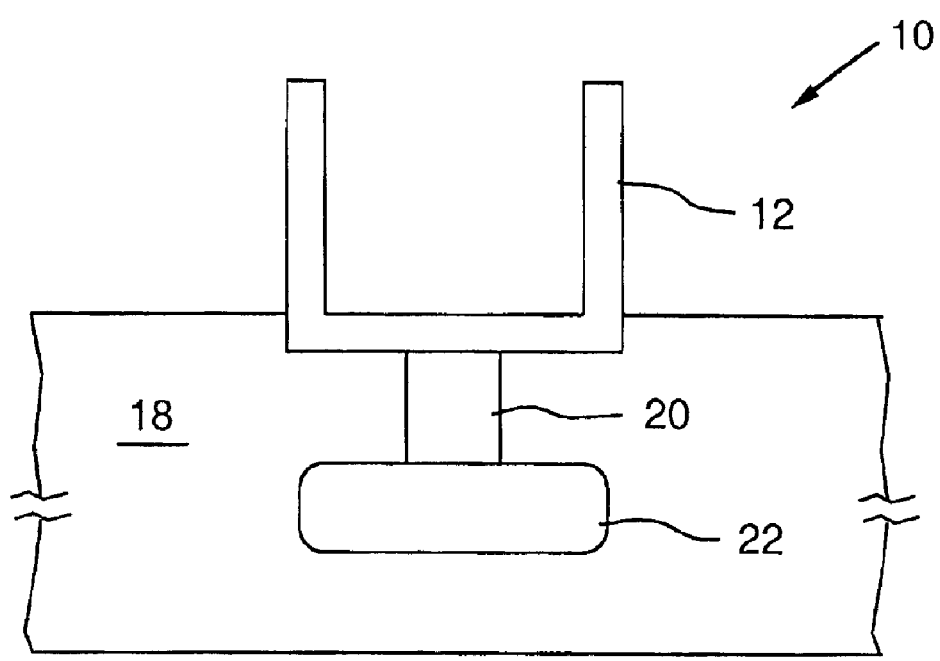
FIG. 4 is a cross-sectional view of the capacitor of FIG. 3 after a portion of the substrate assembly is removed from around the first electrode.

FIG. 4 is a cross-sectional view of the capacitor 10 after a portion of the substrate assembly 18 has been removed to expose vertical portions of the first electrode 12. The substrate assembly 18 may be removed by, for example, an etch that is selective to the substrate assembly 18 but which does not etch the first electrode 12. The substrate assembly 18 may be etched so that the first electrode 12 remains partially recessed in the substrate assembly 18, thereby providing structural stability to the capacitor 10.

Figure 5:
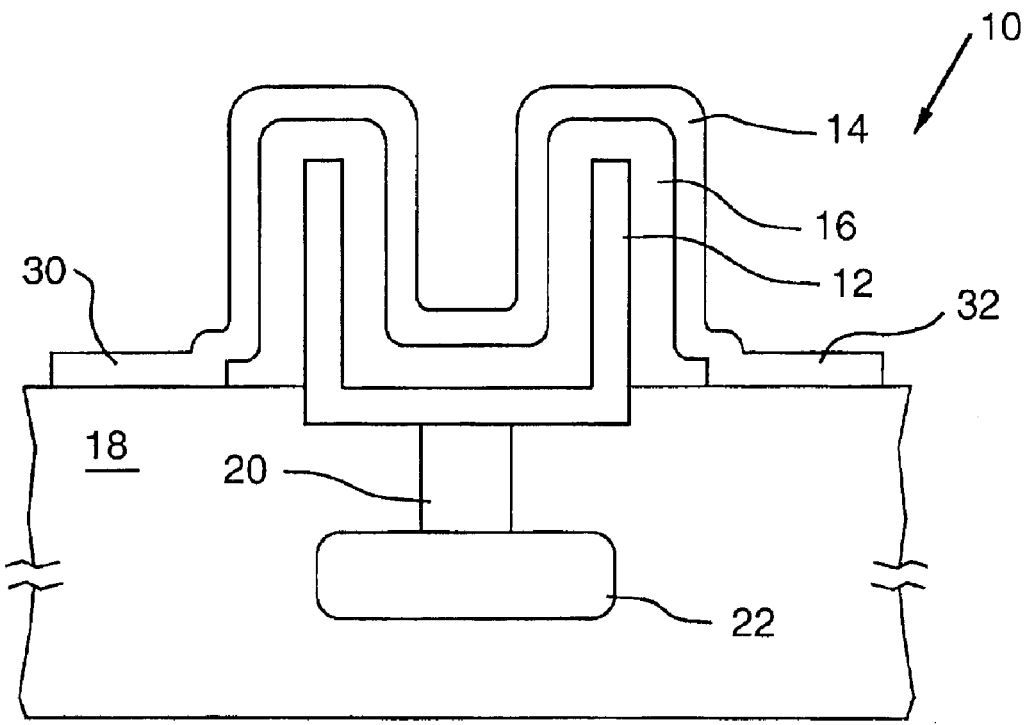
FIG. 5 is a cross-sectional view of the capacitor of FIG. 4 after a dielectric and second conductor, including a strap, are formed.

FIG. 5 is a cross-sectional view of the capacitor 10 after the dielectric 16 and a second electrode 14 have been formed over the first electrode 12, thereby completing the capacitor 10. The dielectric 16 may be formed, for example, by forming a layer of the dielectric 16 on the entire surface, and then selectively removing the dielectric 16 so that it remains only where desired. In particular, the dielectric 16 may be deposited over the entire surface by sputtering or CVD. The dielectric 16 on the first electrode 12 may be masked, such as with photoresist, and the exposed dielectric may be removed with a selective etch. Alternatively, the insulating dielectric 16 need not be removed at all. The second electrode 14 may be formed after the dielectric 16 and in a manner similar to that used to form the dielectric 16. In contrast to the embodiment illustrated in FIG. 1, the capacitor 10 may include a portion 30 of the second electrode 14, known as a strap 30, formed as a contact for connecting the second electrode 14 to another portion of the device in which the capacitor 10 is formed. Similarly, another portion 32 of the second electrode 14 may connect to other capacitors so as to tie several second electrodes together at a common potential, such as ground.

Figure 6:
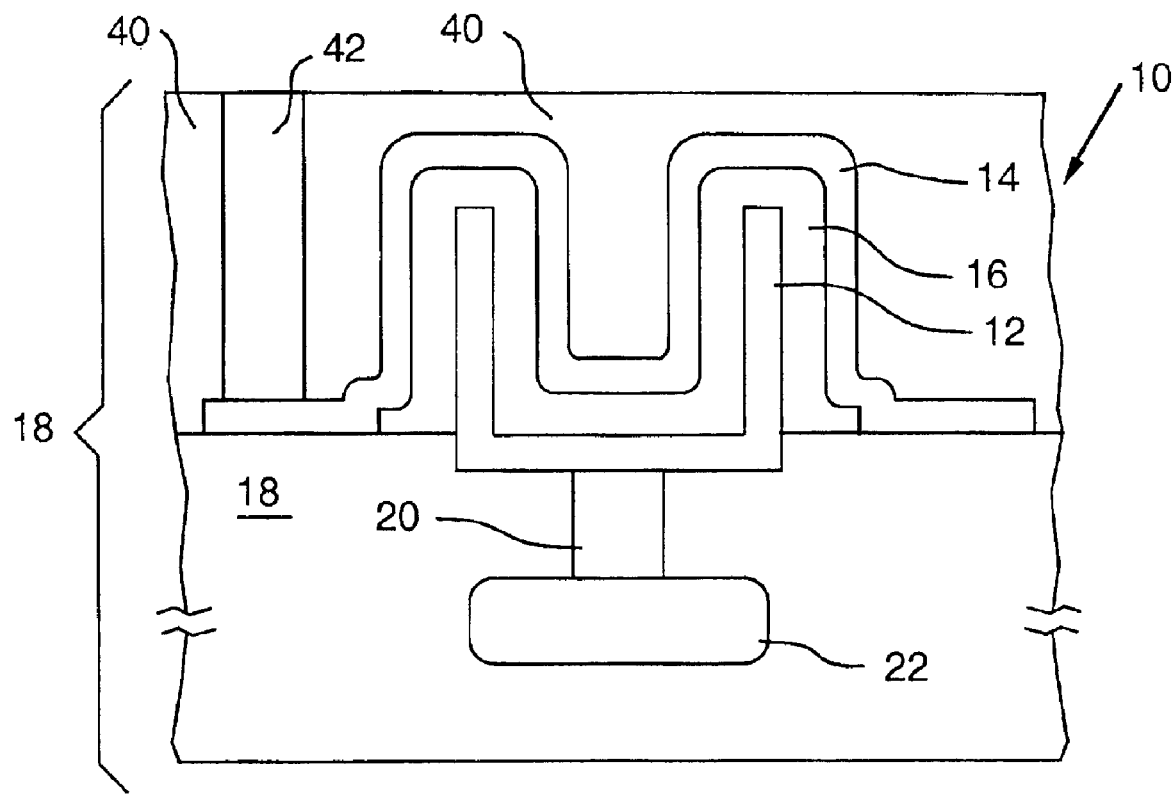
FIG. 6 is a cross-sectional view of the capacitor of FIG. 5 after an additional layer is formed over the capacitor.

FIG. 6 is a cross-sectional view of the capacitor 10 after an additional layer 40 is formed over the capacitor 10. The additional layer 40 may be used to separate the capacitor 10 from whatever may be formed above the capacitor 10. The additional layer 40 may be formed, for example, by a CVD process and from the same materials used to form lower layers of the substrate assembly 18. The additional layer 40 may be planarized, such as by CMP, and an interconnect 42 may be formed in the additional layer 40 to connect the second electrode 14, via the strap 30, to another portion of the device in which the capacitor 10 is formed.

Figure 7:
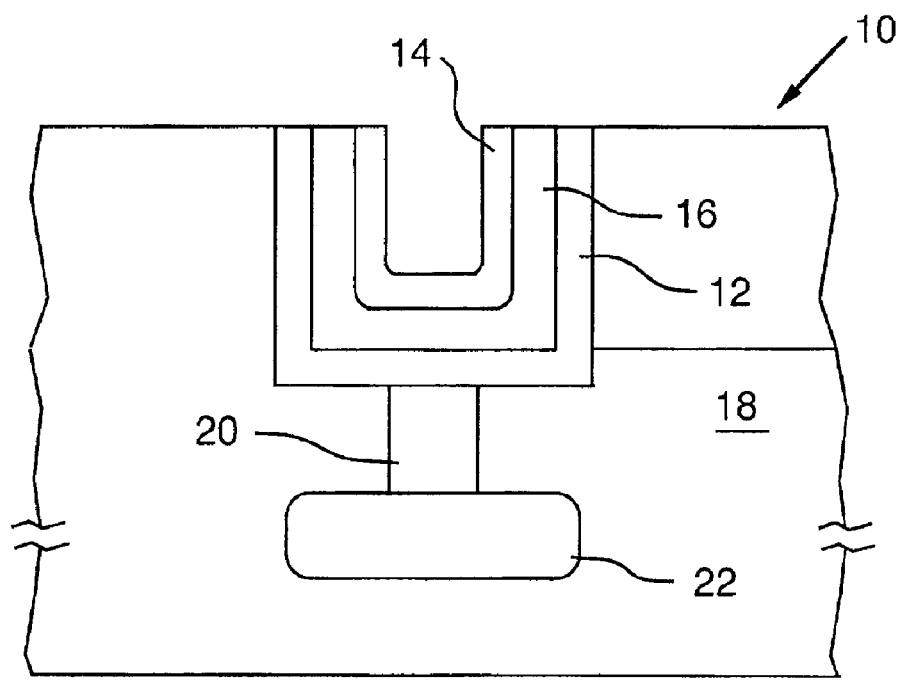
FIG. 7 is a cross-sectional view of an alternative embodiment of a capacitor wherein the dielectric and second electrode are formed only on the inside of the first electrode.

FIG. 7 is a cross-sectional view of an alternative embodiment of the capacitor 10 in which the dielectric 16 and the second electrode 14 are formed only within the first electrode 12. In that embodiment, the substrate assembly 18 may not be etched as described hereinabove with respect to FIG. 4. The dielectric 16 and second electrode 14 may be formed in a manner similar to the first electrode 12, such as by CVD followed by mechanical abrasion to remove unwanted material from the top surface of the substrate assembly 18.

Figure 8:
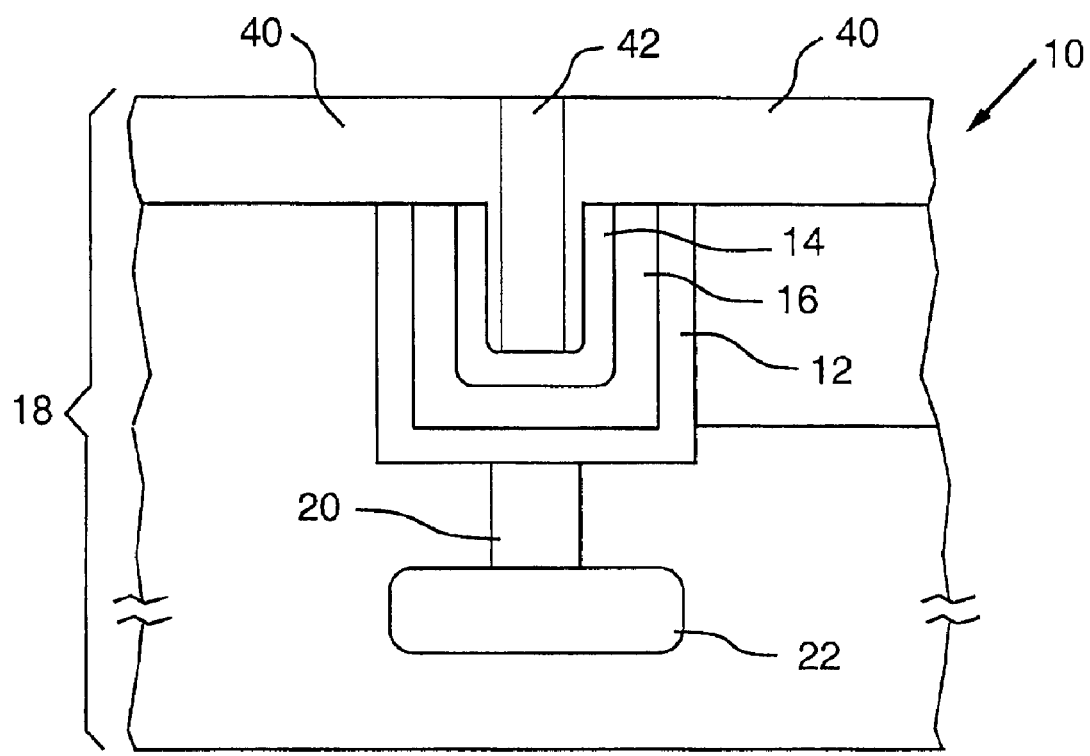
FIG. 8 is a cross-sectional view of the capacitor of FIG. 7 after an additional layer and interconnect are formed.

FIG. 8 is a cross-sectional view of the capacitor 10 illustrated in FIG. 7 after an additional layer 40 has been formed and after an interconnect 42 has been formed connecting the second electrode 14 to another portion of the device in which the capacitor 10 is formed. In the illustrated embodiment, the interconnect 42 is connected to the second electrode 14 without the use of the strap 30 (illustrated in FIGS. 5 and 6).

Figure 9:
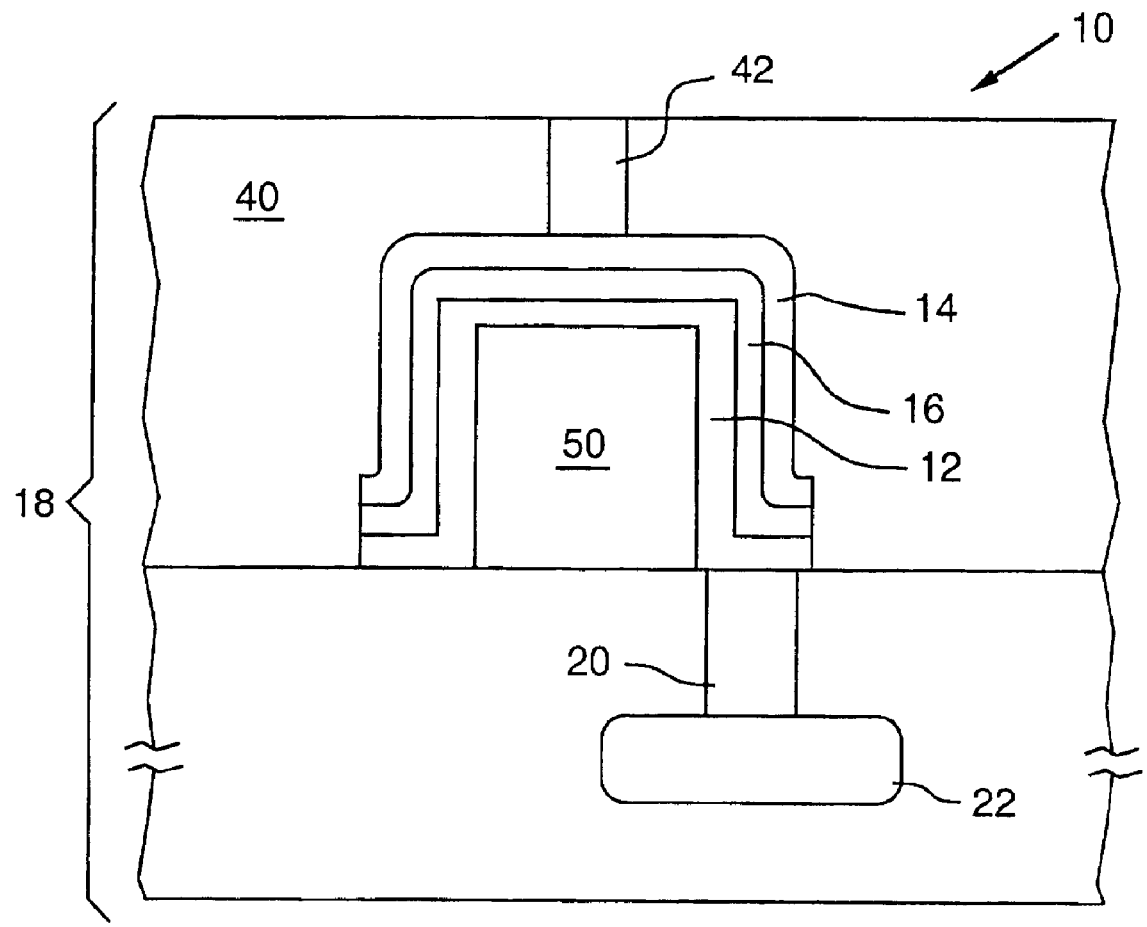
FIG. 9 is a cross-sectional view of a post capacitor according to the teachings of the present invention.

FIG. 9 is a cross-sectional view of an alternative embodiment of the present invention formed as a post capacitor 10. That embodiment includes the first electrode 12, the second electrode 14, and the dielectric 16 formed on a post 50. The post 50 may be formed, for example, by forming a temporary layer on the substrate assembly 18, forming an opening in the temporary layer, filling the opening with a material to form the post 50, and removing the temporary layer to leave the post 50. The post 50 may be formed, for example, from polysilicon.

Figure 10:
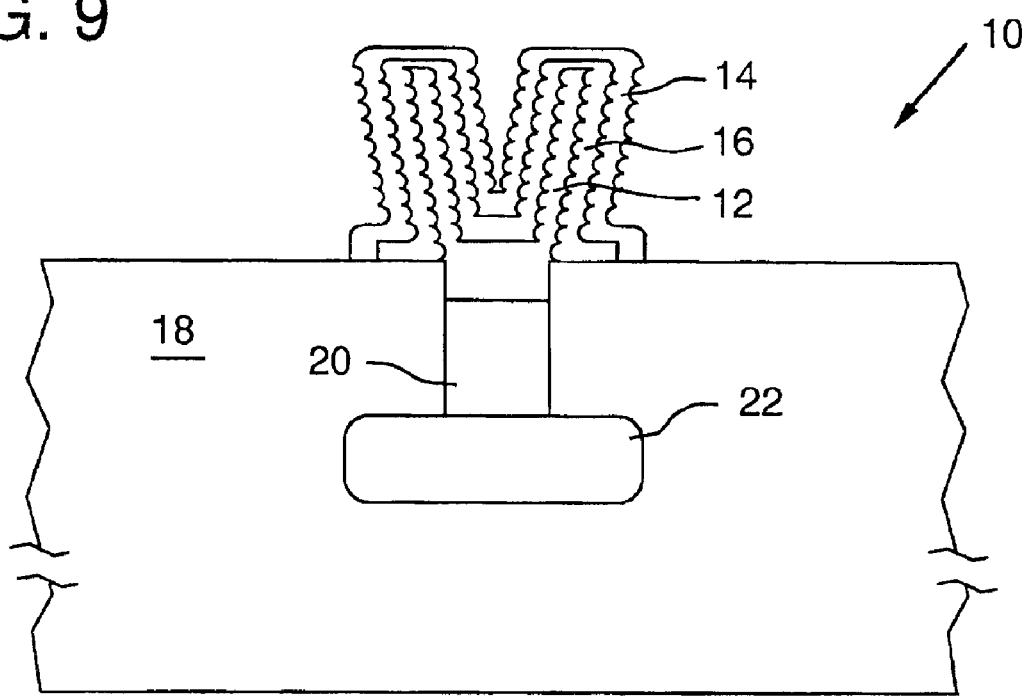
FIG. 10 is a cross-sectional view of the capacitor including the first electrode, second electrode, and dielectric are formed from a non-smooth material.

FIG. 10 is a cross-sectional view of an alternative embodiment of the present invention wherein the first and second electrodes 12, 14 and the dielectric 16 have a non-smooth surface. The non-smooth surfaces increases the surface area of the first and second electrodes 12, 14 and the dielectric 16, thereby increasing the capacitance of the capacitor 10. The capacitor 10 may be formed, for example, by using a non-smooth mold, such as hemispherical grain (HSG) polysilicon, on which the first electrode 12 may be formed. Such a process results in the first electrode 12 having an inverted hemispherical grain on the side formed on the HSG polysilicon (that is the outside in the illustrated embodiment), and an inverted hemispherical grain on the side opposite that formed on the HSG polysilicon (that is the inside in the illustrated embodiment). Thereafter, the mold may be removed and the dielectric 16 and second electrode 14 may be formed over the first electrode 12, conforming to its non-smooth surface and assuming a similar non-smooth surface. The dielectric 16 and the second electrode 14 formed by that process have hemispherical grain on one side and inverted hemispherical grain on another side, in a manner analogous to the first electrode 12. It is desirable that the first electrode 12 be set into a recess, such as a recessed interconnect 20, so as to provide structural stability to the first electrode 12.

Figure 11:
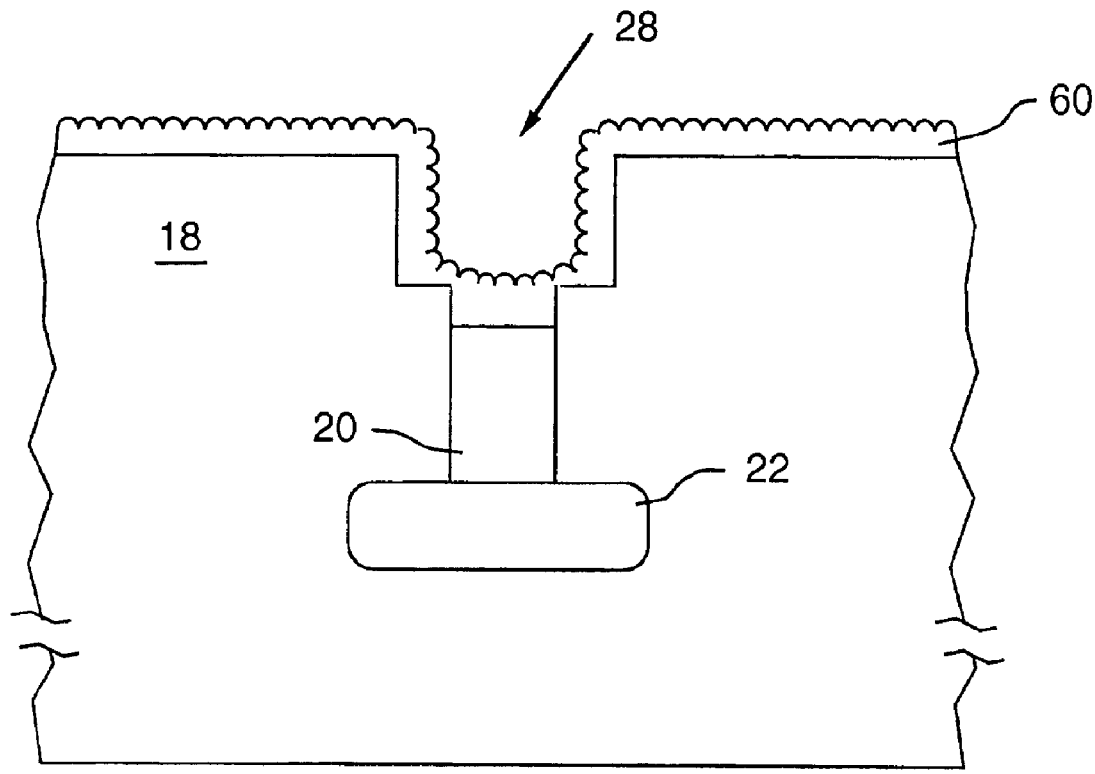
FIG. 11 is a cross-sectional view of the capacitor of FIG. 10 in an early stage of fabrication after a layer of hemispherical grain polysilicon is formed in the opening.

FIG. 11 is a cross-sectional view of the capacitor 10 illustrated in FIG. 10 in an early stage of fabrication wherein a layer of HSG polysilicon 60 is formed in the opening 28 and on the top surface of the substrate assembly 18. The layer of HSG polysilicon 60 may be formed, for example, with a CVD process. The interconnect 20 is recessed below the bottom surface of the opening 26.

Figure 12:
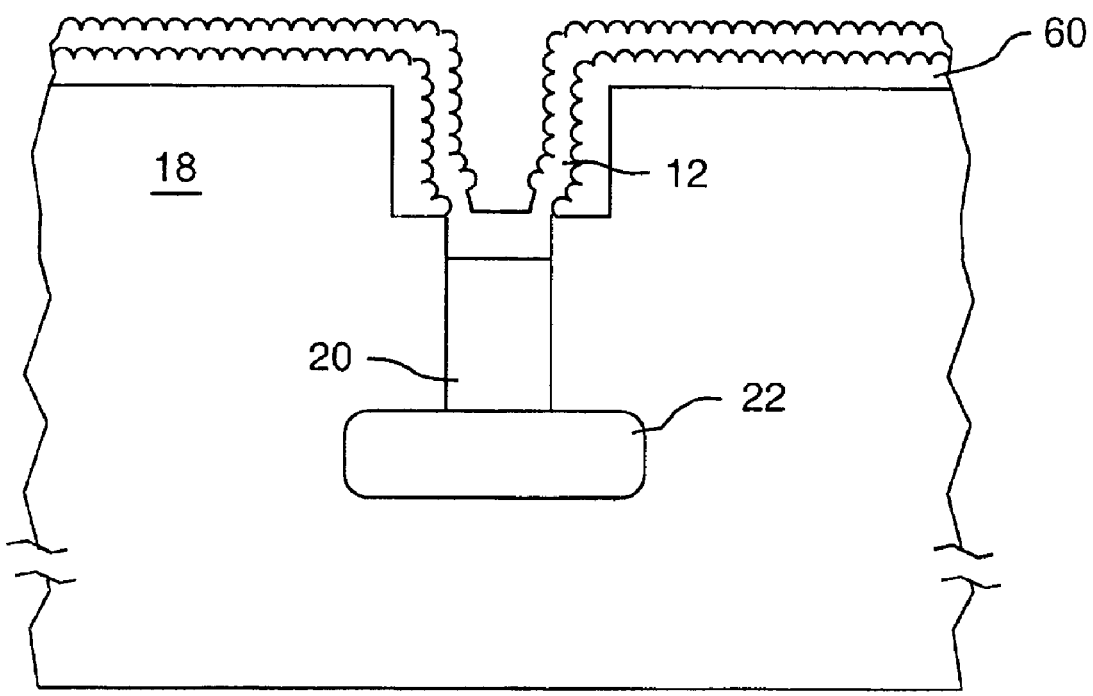
FIG. 12 is a cross-sectional view of the capacitor of FIG. 11 after the material forming the first electrode is formed.

FIG. 12 is a cross-sectional view of the capacitor 10 after a conductive layer that will form the first electrode 12 is formed over the HSG polysilicon 60. HSG polysilicon has a course, grainy surface, and when the layer that will form the first electrode 12 is formed on the HSG polysilicon 60, that layer conforms to the HSG polysilicon 60 and assumes a similar, non-smooth surface. The non-smooth surface of the HSG polysilicon has a surface area that is between about 150% and about 200% greater than the surface area of smooth polysilicon. It is desirable to etch the HSG polysilicon 60 from the recessed interconnect 20 before the layer that will form the first electrode 12 is formed, as is done in the illustrated embodiment. As a result, the first electrode 12 will be in direct contact with the interconnect 20. Otherwise, if the HSG polysilicon 60 is between the first conductor 12 and the interconnect 20, it may oxidize and increase the resistance of between the interconnect 20 and the first electrode 12. Furthermore, if HSG polysilicon 60 is supporting the first electrode 12, the first electrode 12 may be damaged or destroyed when the HSG polysilicon 60 in removed in a subsequent fabrication step.

Figure 13:
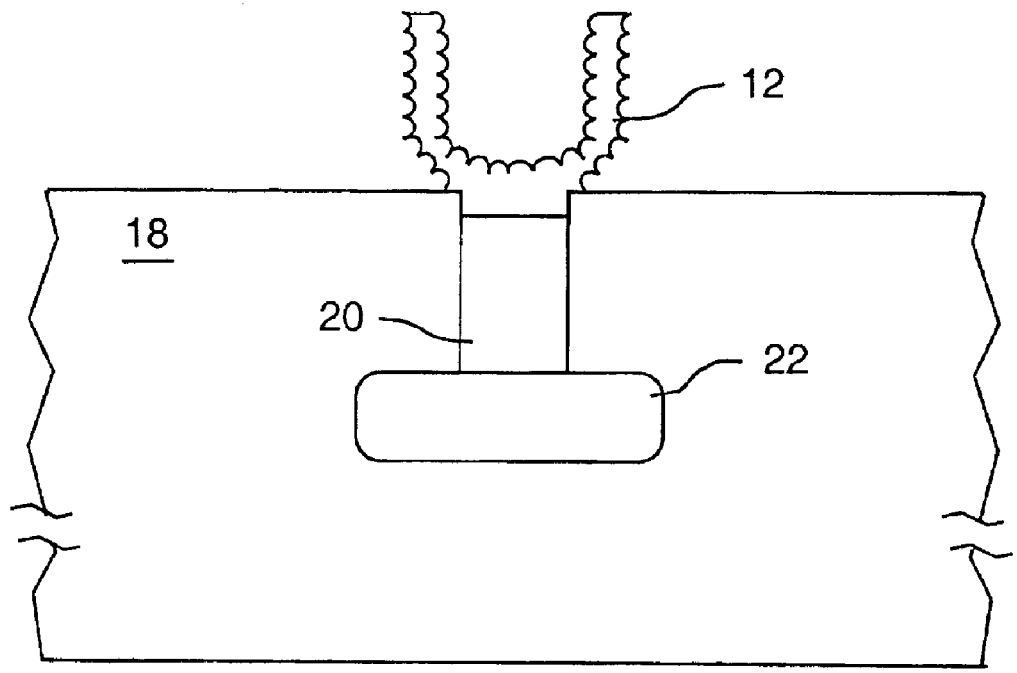
FIG. 13 is a cross-sectional view of the capacitor of FIG. 12 after the substrate is partially removed and after the hemispherical grain polysilicon is removed.

FIG. 13 is a cross-sectional view of the capacitor 10 after the substrate assembly 18 is partially removed and the HSG polysilicon 60 is removed. The partial removal of the substrate assembly 18 exposes the HSG polysilicon 60, which may then be removed with a selective etch, such as tetra methyl ammonium hydroxide, leaving the first electrode 12. Thereafter, the dielectric 16 and the second electrode 14 may be formed to result in the capacitor illustrated in FIG. 10. The dielectric 16 and second electrode 14, when formed over the first electrode 12, will also have a grainy surface, thereby increasing their surface areas.

Figure 14:
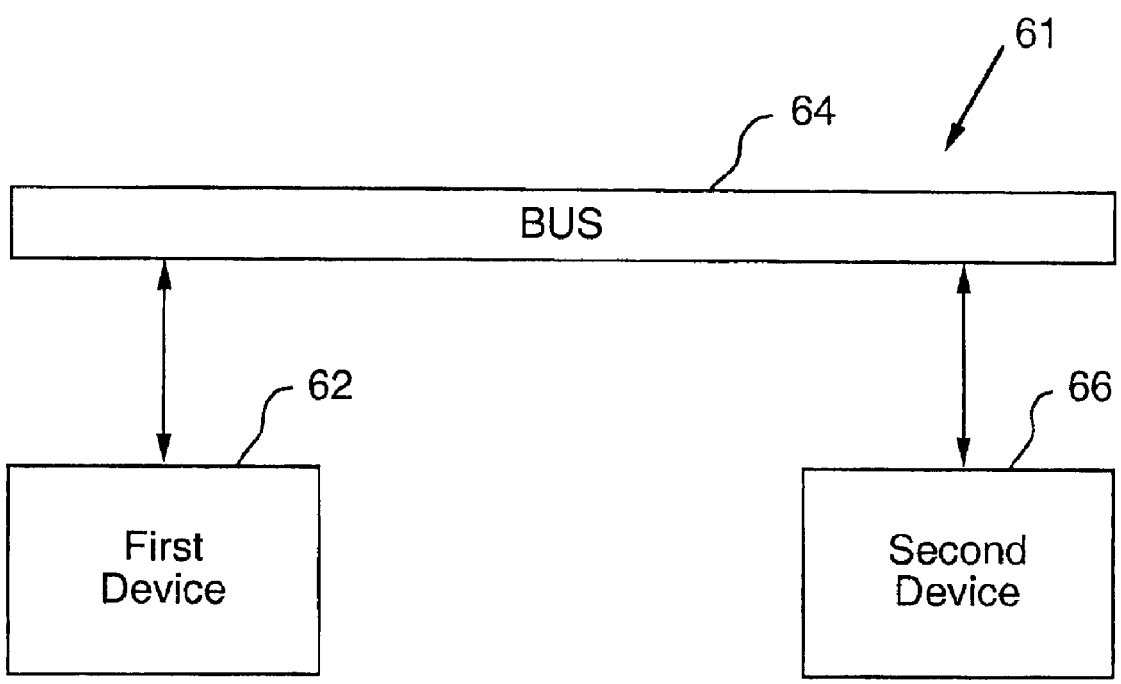
FIG. 14 is a block diagram of a system including devices constructed according to the teachings of the present invention.

FIG. 14 is a high level block diagram illustrating a system 61 including a first device 62, a bus 64, and a second device 66. The system 61 may be, for example, a memory system or a computer system. The first device 62 may be a processor, and the second device 66 may be a memory. The first device 62 and the second device 66 may communicate via the bus 64. The first and second devices 62, 66 may include capacitors 10, constructed according to the teaching of the present invention.

The present invention also includes a method of forming structures and devices, such as capacitors. The method includes forming a first electrode selected from a group consisting of transition metals, conductive metal-oxides, and alloys thereof. The method also includes forming a second electrode and forming a dielectric between the first and second electrodes. The method includes many variations, as described in the teachings hereinabove.

Those of ordinary skill in the art will recognize that many modifications and variations of the present invention may be implemented. For example, one of the interconnects 22, 42 may be omitted and the corresponding conductor may be left to "float". The foregoing description and the following claims are intended to cover all such modifications and variations.

What is claimed is:

1. A method of forming a capacitor, the method comprising:

forming an opening in a substrate assembly, wherein the opening extends to a first surface of an interconnect recessed within the substrate assembly;

forming a non-smooth mold in the opening and on the first surface of the interconnect;

removing a portion of the non-smooth mold from the first surface of the interconnect;

forming a first electrode having a non-smooth surface, wherein forming the first electrode includes forming the first electrode on the non-smooth mold and the first surface of the interconnect with a material selected from the group consisting of transition metals, conductive oxides, alloys thereof, and combinations thereof;

forming a dielectric on the first electrode and an uppermost surface of the substrate assembly; and forming a second electrode on the dielectric and the uppermost surface of the substrate assembly, wherein forming the second electrode includes forming at least one non-smooth surface.

2. The method of claim 1, wherein forming the opening in the substrate assembly includes etching the substrate assembly.

3. The method of claim 2, wherein etching the substrate assembly includes anisotropically etching the substrate assembly.

4. The method of claim 1, wherein forming the non-smooth mold in the opening includes forming a layer of hemispherical grain polysilicon.

5. The method of claim 4, wherein forming the layer of hemispherical grain polysilicon includes depositing a layer of hemispherical grain polysilicon in the opening.

6. The method of claim 5, wherein depositing the layer of hemispherical grain polysilicon includes depositing a layer of hemispherical grain polysilicon by chemical vapor deposition.

7. The method of claim 1, wherein removing the portion of the non-smooth mold includes etching the non-smooth mold.

8. The method of claim 1, wherein forming the first electrode on the non-smooth mold and the interconnect includes depositing a material selected from the group consisting of transition metals, conductive oxides, alloys thereof, and combinations thereof on the non-smooth mold and the interconnect.

9. The method of claim 8, wherein depositing the material selected from the group consisting of transition metals, conductive oxides, alloys thereof, and combinations thereof on the non-smooth mold and the interconnect includes depositing a material selected from the group consisting of transition metals, conductive oxides, alloys thereof, and combinations thereof on the non-smooth mold and the interconnect by chemical vapor deposition.

10. The method of claim 8, wherein depositing the material selected from the group consisting of transition metals, conductive oxides, alloys thereof, and combinations thereof on the non-smooth mold and the interconnect includes sputtering a material selected from the group consisting of transition metals, conductive oxides, alloys thereof, and combinations thereof on the non-smooth mold and the interconnect.

11. The method of claim 8, wherein depositing the material selected from the group consisting of transition metals, conductive oxides, alloys thereof, and combinations thereof on the non-smooth mold and the interconnect includes depositing a transition metal selected from the group consisting of Pt, Rh, Ir, Ru, and Pd.

12. The method of claim 8, wherein depositing the material selected from the group consisting of transition metals, conductive oxides, alloys thereof, and combinations thereof on the non-smooth mold and the interconnect includes depositing a conductive oxide selected from the group consisting of $IrO_x$, $RuO_x$, and $RhO_x$, wherein X<4.

13. The method of claim 1, wherein forming the dielectric includes:

removing a portion of the substrate assembly; and removing the non-smooth mold.

14. The method of claim 13, wherein removing the portion of the substrate assembly includes etching the substrate assembly.

15. The method of claim 13, wherein removing the non-smooth mold includes removing a layer of hemispherical grain polysilicon.

16. The method of claim 15, wherein removing the layer of hemispherical grain polysilicon includes etching a layer of hemispherical grain polysilicon.

17. The method of claim 13, wherein forming the dielectric includes forming a non-smooth surface.

18. The method of claim 13, wherein forming the dielectric includes depositing an insulating metal oxide.

19. The method of claim 18, wherein depositing the insulating metal oxide includes depositing a material selected from the group consisting of barium strontium titanate, $SrTiO_3$, $Sr_wBi_xTa_yO_z$, $Ba_xSr_{1-x}TiO_3$, where 0<x<1, and $Ta_2O_5$ by chemical vapor deposition.

20. The method of claim 18, wherein depositing the insulating metal oxide includes sputtering a material selected from the group consisting of barium strontium titanate, $SrTiO_3$, $Sr_wBi_xTa_yO_z$, $Ba_xSr_{1-x}TiO_3$, where 0<x<1, and $Ta_2O_5$.

21. The method of claim 1, wherein forming the second electrode includes depositing a material selected from the group consisting of transition metals, conductive oxides, alloys thereof, and combinations thereof on the dielectric and the uppermost surface of the substrate assembly.

22. The method of claim 21, wherein depositing the material selected from the group consisting of transition metals, conductive oxides, alloys thereof, and combinations thereof includes depositing a material selected from the group consisting of transition metals, conductive oxides, alloys thereof, and combinations thereof by chemical vapor deposition.

23. The method of claim 21, wherein depositing the material selected from the group consisting of transition metals, conductive oxides, alloys thereof, and combinations thereof includes sputtering a material selected from the group consisting of transition metals, conductive oxides, alloys thereof, and combinations thereof.

24. The method of claim 21, wherein depositing the material selected from the group consisting of transition metals, conductive oxides, alloys thereof, and combinations thereof includes depositing a transition metal selected from the group consisting of Pt, Rh, Ir, Ru, and Pd.

25. The method of claim 21, wherein depositing the material selected from the group consisting of transition metals, conductive oxides, alloys thereof, and combinations thereof includes depositing a conductive oxide selected from the group consisting of $IrO_x$, $RuO_x$, and $RhO_x$, wherein x<4.

26. The method of claim 1, wherein forming the second electrode includes depositing a material selected from the group consisting of conductive metal nitrides, aluminum, and polysilicon on the dielectric and the uppermost surface of the substrate assembly.

27. The method of claim 26, wherein depositing the material selected from the group consisting of conductive metal nitrides, aluminum, and polysilicon includes depositing a conductive metal nitride selected from the group comprising WN, TiN, and TaN.

* * * * *